United States Patent
Fujino et al.

(10) Patent No.: US 11,257,781 B2
(45) Date of Patent: Feb. 22, 2022

(54) METHOD FOR CALIBRATING WIRE CLAMP DEVICE

(71) Applicant: SHINKAWA LTD., Tokyo (JP)

(72) Inventors: Noboru Fujino, Tokyo (JP); Hisashi Ueda, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 354 days.

(21) Appl. No.: 16/320,466

(22) PCT Filed: Jun. 13, 2017

(86) PCT No.: PCT/JP2017/021710
§ 371 (c)(1),
(2) Date: Jan. 24, 2019

(87) PCT Pub. No.: WO2017/217385
PCT Pub. Date: Dec. 21, 2017

(65) Prior Publication Data
US 2019/0237428 A1    Aug. 1, 2019

(30) Foreign Application Priority Data

Jun. 15, 2016 (JP) .............................. JP2016-118698

(51) Int. Cl.
  *H01L 23/00* (2006.01)
  *B06B 1/06* (2006.01)
  *B23K 20/10* (2006.01)

(52) U.S. Cl.
CPC ................ *H01L 24/78* (2013.01); *B06B 1/06* (2013.01); *B23K 20/10* (2013.01); *H01L 24/85* (2013.01);
(Continued)

(58) Field of Classification Search
CPC ........... H01L 24/78; H01L 2224/78001; H01L 2224/78301
See application file for complete search history.

(56) References Cited

U.S. PATENT DOCUMENTS

| 5,323,948 A | 6/1994 | Yamazaki et al. |
| 5,388,751 A | 2/1995 | Harada et al. |

(Continued)

FOREIGN PATENT DOCUMENTS

| JP | S63111634 | 5/1988 |
| JP | 401245532 | * 9/1989 |

(Continued)

OTHER PUBLICATIONS

"International Search Report (Form PCT/ISA/210)" of PCT/JP2017/021710, dated Aug. 1, 2017, with English translation thereof, pp. 1-4.

*Primary Examiner* — Minh N Trinh
(74) *Attorney, Agent, or Firm* — JCIPRNET

(57) ABSTRACT

A method for calibrating a wire clamp device includes: preparing a wire clamp device provided with a pair of arm parts having tips for clamping a wire, the arms extending from the tips toward base ends, and a drive part provided with a piezoelectric element for drive, connected to the base ends of the pair of arm parts and opening/closing the tips of the pair of arm parts; a step of detecting, by electrical continuity between the tips, a timing at which the pair of arm parts enters a closed state when the piezoelectric element for drive is driven, and acquiring a reference voltage; and a step of calibrating, on the basis of the reference voltage, an application voltage to be applied to the piezoelectric element for drive. Thus, it is possible to perform accurate and stable wire bonding.

2 Claims, 5 Drawing Sheets

(52) U.S. Cl.
CPC .... *H01L 24/45* (2013.01); *H01L 2224/45139* (2013.01); *H01L 2224/45144* (2013.01); *H01L 2224/45147* (2013.01); *H01L 2224/78001* (2013.01); *H01L 2224/7892* (2013.01); *H01L 2224/78301* (2013.01); *H01L 2224/78349* (2013.01); *H01L 2224/78353* (2013.01); *H01L 2224/78621* (2013.01); *H01L 2224/78801* (2013.01); *H01L 2224/78821* (2013.01); *H01L 2224/78901* (2013.01); *H01L 2224/859* (2013.01); *H01L 2224/85205* (2013.01)

(56) References Cited

U.S. PATENT DOCUMENTS

| | | | |
|---|---|---|---|
| 5,897,049 | A | 4/1999 | Nakamura et al. |
| 6,948,387 | B2 * | 9/2005 | Chen .................... G01L 5/0085 73/1.08 |
| 9,446,524 | B2 * | 9/2016 | Zhang .................... H01L 24/74 |
| 2015/0128405 | A1 * | 5/2015 | Zhang .................... H01L 24/74 29/559 |
| 2019/0237428 | A1 * | 8/2019 | Fujino .................... H01L 24/85 |
| 2019/0279957 | A1 * | 9/2019 | Uchida ................ B23K 20/004 |

FOREIGN PATENT DOCUMENTS

| | | |
|---|---|---|
| JP | H05259213 | 10/1993 |
| JP | H06260524 | 9/1994 |
| JP | H0927511 | 1/1997 |
| JP | H09162228 | 6/1997 |
| JP | H10178032 | 6/1998 |
| JP | 2981948 | 11/1999 |
| JP | 2011049498 | 3/2011 |

* cited by examiner

METHOD FOR CALIBRATING WIRE CLAMP DEVICE

CROSS-REFERENCE TO RELATED APPLICATION

This application is a 371 of international application of PCT application serial no. PCT/JP2017/021710, filed on Jun. 13, 2017, which claims the priority benefit of Japan application no. 2016-118698, filed on Jun. 15, 2016. The entirety of each of the abovementioned patent applications is hereby incorporated by reference herein and made a part of this specification.

TECHNICAL FIELD

The present invention relates to a method of calibrating a wire clamp device and a wire bonding apparatus.

BACKGROUND ART

In a wire bonding apparatus for performing wire bonding of a semiconductor die to a substrate or the like, a wire clamp device is provided above a bonding tool through which inserting a wire is inserted. For example, Patent Document 1 discloses a wire clamp device including a pair of arm parts each having a tip for clamping a wire and a drive part provided with a piezoelectric element opening and closing the pair of arm parts. According to the wire clamp device, a distance between tips of the pair of arm parts is controlled in accordance with the value of a voltage applied to the piezoelectric element. By such control, the wire can be constrained by closing the arm parts, or the wire can be released by opening the arm parts.

CITATION LIST

Patent Literature

[Patent Literature 1]
Japanese Patent No. 2981948

SUMMARY OF INVENTION

Technical Problem

However, in the related art, it is not possible to confirm absolute values of opening amounts of the arm parts corresponding to a voltage to be applied to the piezoelectric element. For this reason, even when the value of a voltage to be applied to the piezoelectric element is fixed, opening amounts of the arm parts may vary for each wire clamp device. Particularly, in the wire clamp device, since absolute values of opening amounts of the arm parts tend to fluctuate due to various factors such as changes in a component such as the piezoelectric element over time and attachment to the main body of the wire bonding apparatus, solving this problem is important to improve the reliability of wire bonding.

The present invention is contrived in view of such circumstances, and an object thereof is to provide a method of calibrating a wire clamp device and a wire bonding apparatus which are capable of performing accurate and stable wire bonding.

Solution to Problem

A method of calibrating a wire clamp device according to an aspect of the present invention is a method of calibrating a wire clamp device and includes preparing the wire clamp device that includes a pair of arm parts each having a tip for clamping a wire and extending from the tip toward a base end thereof, and a drive part coupled to base ends of the pair of arm parts and provided with a piezoelectric element for driving opening and closing the tips of the pair of arm parts, detecting a timing when the pair of arm parts are set to be in a closed state by driving of the piezoelectric element for driving, and setting a voltage to be applied to the piezoelectric element for driving on the basis of detection results.

According to the above-described configuration, a timing when the pair of arm parts are set to be in a closed state is detected by electrical conduction between the tips of the pair of arm parts, and a driving voltage to be applied to the piezoelectric element for driving is calibrated on the basis of a reference voltage at which the pair of arm parts are set to be in a closed state. Thereby, it is possible to accurately adjust opening amounts of the arm parts. Accordingly, it is possible to perform accurate and stable wire bonding.

A method of calibrating a wire clamp device according to another aspect of the present invention includes a step of preparing a wire clamp device that includes a pair of arm parts and a drive part, each of the pair of arm parts having a tip for clamping a wire and extending from the tip toward a base end thereof, the drive part including a piezoelectric element for driving that opens and closes the tips of the pair of arm parts with a driving voltage and a piezoelectric element for detection that detects a stress generated in association with opening and closing of the pair of arm parts due to the piezoelectric element for driving, and the drive part being coupled to the base ends of the pair of arm parts, a step of detecting a timing when the pair of anus are set to in a closed state on the basis of changes in the stress when the piezoelectric element for driving is driven with a driving voltage, and acquiring a reference voltage at which the pair of arms are set to be in the closed state, and a step of calibrating a driving voltage to be applied to the piezoelectric element for driving on the basis of the reference voltage.

According to the above-described configuration, a timing when the pair of arm parts are set to be in a closed state is detected on the basis of changes in stress of the piezoelectric element for detection, and a driving voltage to be applied to the piezoelectric element for driving is calibrated on the basis of a reference voltage at which the pair of arm parts are set to be in a closed state. Thereby, it is possible to accurately adjust opening amounts of the arm parts. Accordingly, it is possible to perform accurate and stable wire bonding.

In the above-described method, the piezoelectric element for detection may be provided between the piezoelectric element for driving and the base ends of the pair of arm parts.

In the above-described method, the drive part of the wire clamp device may be provided with a strain sensor coming into contact with the piezoelectric element for driving, and the method may further include a step of detecting an output value of the strain sensor accompanying driving of the piezoelectric element for driving and controlling the driving voltage to be applied to the piezoelectric element for driving on the basis of the output value of the strain sensor in wire bonding processing after the driving voltage to be applied to the piezoelectric element for driving is calibrated.

A wire bonding apparatus according to still another aspect of the present invention includes a wire clamp device that includes a pair of arm parts each having a tip for clamping a wire and extending from the tip toward a base end thereof, and a drive part coupled to base ends of the pair of arm parts and provided with a piezoelectric element for driving opening and closing the tips of the pair of arm parts with a driving voltage, a reference voltage acquisition unit that detects a timing when the pair of arm parts are set to be in a closed state by electrical conduction between the tips of the pair of arm parts when the piezoelectric element for driving is driven with a driving voltage, and acquires a reference voltage at which the pair of arm parts are set to be in a closed state, and a voltage calibration unit that calibrates a driving voltage to be applied to the piezoelectric element for driving on the basis of the reference voltage acquired by the reference voltage acquisition unit.

According to the above-described configuration, a timing when the pair of arm parts are set to be in a closed state is detected by electrical conduction between the tips of the pair of arm parts, and a driving voltage to be applied to the piezoelectric element for driving is calibrated on the basis of a reference voltage at which the pair of arm parts are set to be in a closed state. Thereby, it is possible to accurately adjust opening amounts of the arm parts. Accordingly, it is possible to perform accurate and stable wire bonding.

A wire bonding apparatus according to still another aspect of the present invention includes a wire clamper that includes a pair of arm parts and a drive part, each of the pair of arm parts having a tip for clamping a wire and extending from the tip toward a base end thereof, the drive part including a piezoelectric element for driving that opens and closes the tips of the pair of arm parts with a driving voltage and a piezoelectric element for detection that detects a stress generated in association with opening and closing of the pair of arm parts due to the piezoelectric element for driving, and the drive part being coupled to the base ends of the pair of arm parts, a reference voltage acquisition unit that detects a timing when the pair of arms are set to be in a closed state on the basis of changes in the stress when the piezoelectric element for driving is driven with a driving voltage and acquires a reference voltage at which the pair of arms are set to be in the closed state, and a voltage calibration unit that calibrates a driving voltage to be applied to the piezoelectric element for driving on the basis of the reference voltage acquired by the reference voltage acquisition unit.

According to the above-described configuration, a timing when the pair of arm parts are set to be in a closed state is detected on the basis of changes in stress of the piezoelectric element for detection, and a driving voltage to be applied to the piezoelectric element for driving is calibrated on the basis of a reference voltage at which the pair of arm parts are set to be in a closed state. Thereby, it is possible to accurately adjust opening amounts of the arm parts. Accordingly, it is possible to perform accurate and stable wire bonding.

In the above-described device, the piezoelectric element for detection may be provided between the piezoelectric element for driving and the base ends of the pair of arm parts.

In the above-described device, the drive part of the wire clamp device may be provided with a strain sensor coming into contact with the piezoelectric element for driving, and the wire bonding apparatus may further include a voltage control unit that detects an output value of the strain sensor accompanying driving of the piezoelectric element for driving and controls the driving voltage to be applied to the piezoelectric element for driving on the basis of the output value of the strain sensor.

Advantageous Effects of Invention

According to the present invention, it is possible to provide a method of calibrating a wire clamp device and a wire bonding apparatus which are capable of performing accurate and stable wire bonding.

DESCRIPTION OF EMBODIMENTS

Figure 1:
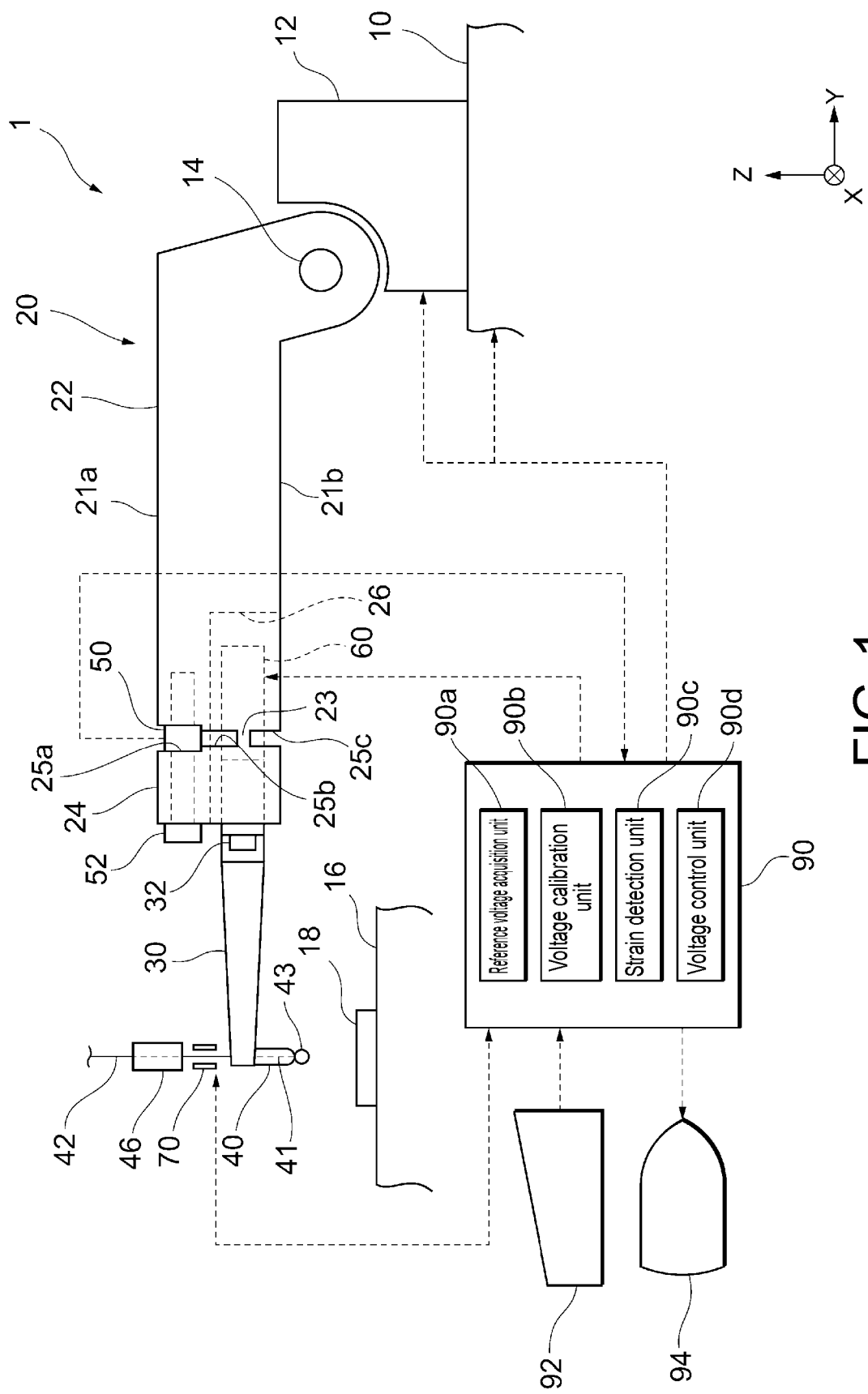
FIG. 1 is a diagram showing the overall outline of a wire bonding apparatus according to a first embodiment of the present invention.

Hereinafter, an embodiment of the present invention will be described. In the following description of drawings, the same or similar components are denoted by the same or similar reference numerals. The drawings are examples, the dimensions and shape of each portion are schematic, and the technical scope of the present invention should not be understood by being limited to the embodiment.

First Embodiment

Figure 2A:
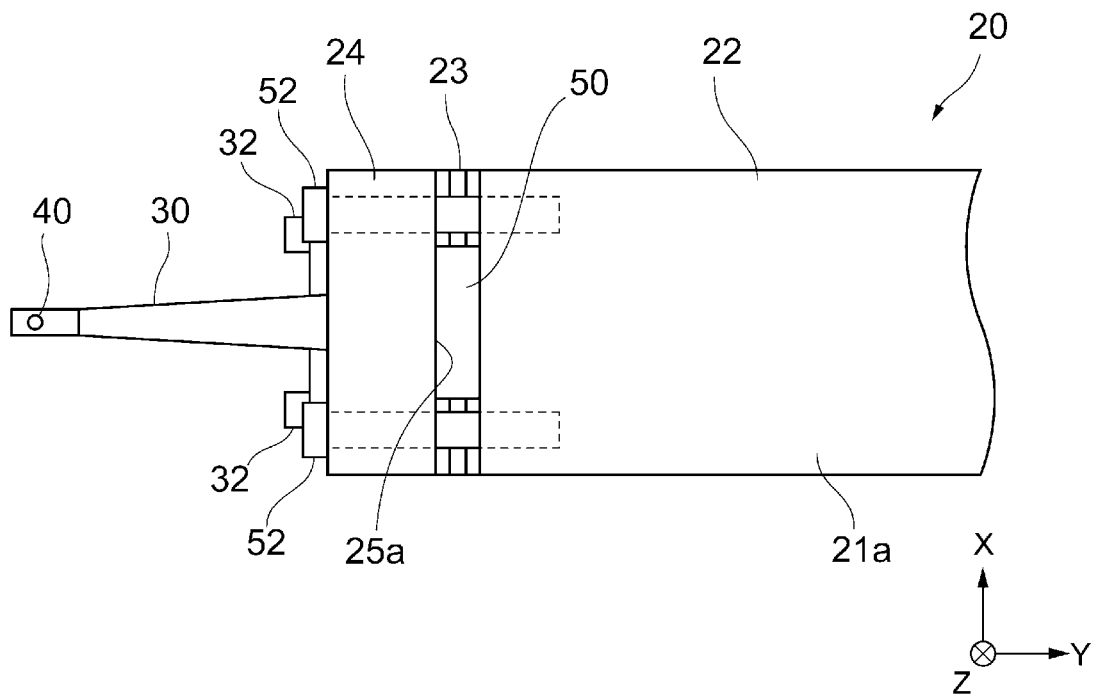
FIGS. 2A and 2B are respectively a top view and a bottom view of a bonding arm in the wire bonding apparatus of FIG. 1.
Figure 2B:
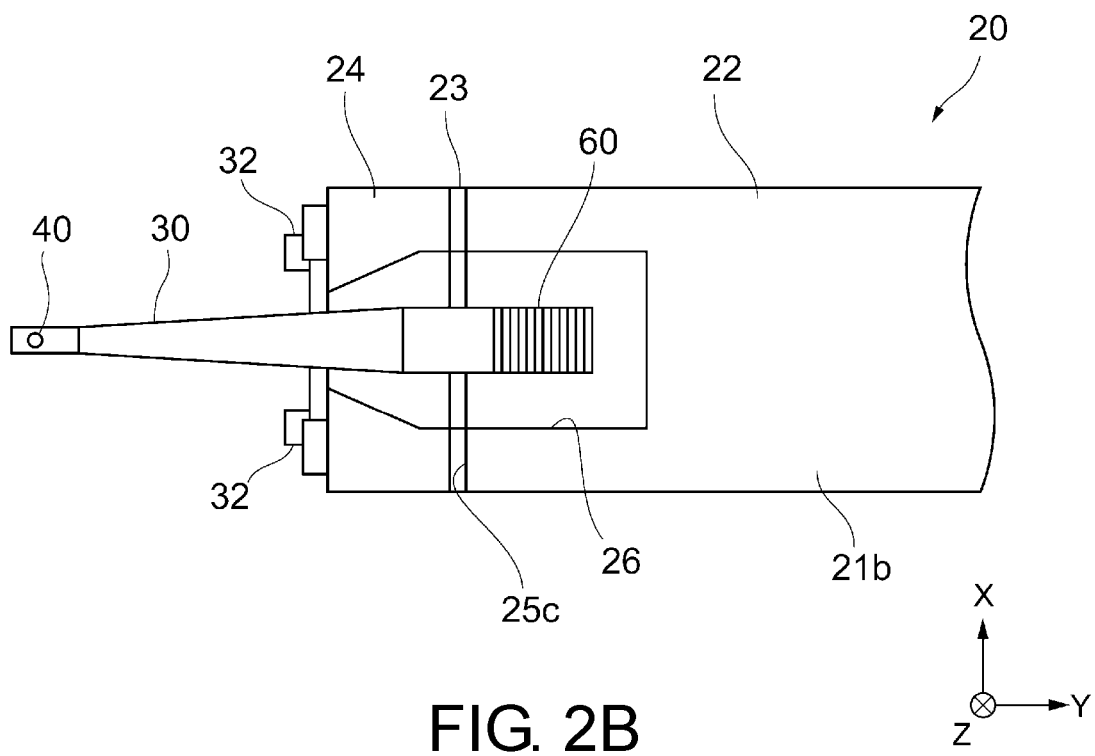
Figure 3:
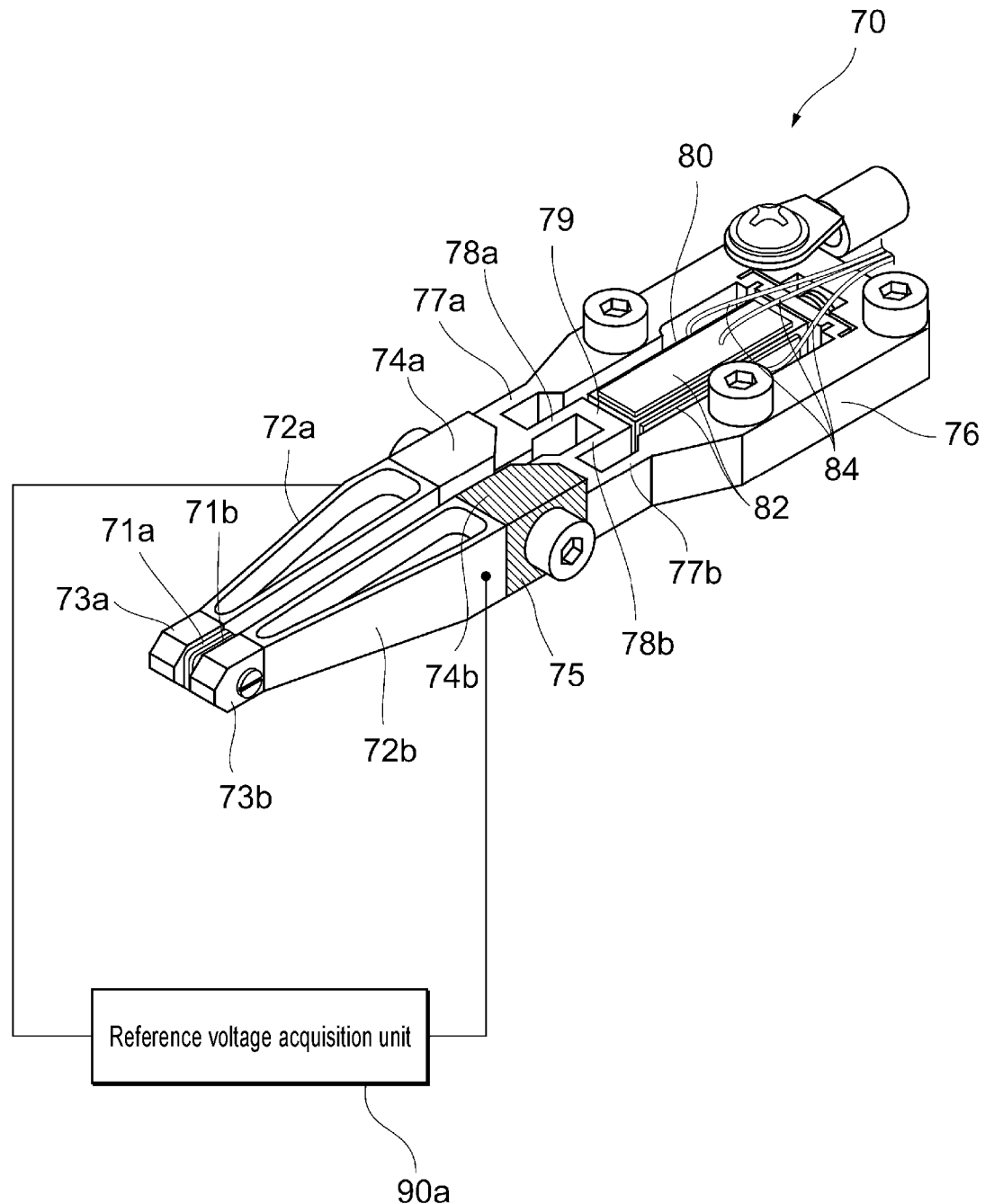
FIG. 3 is a perspective view of a wire clamp device of FIG. 1.

FIG. 1 is a diagram showing the overall outline of a wire bonding apparatus according to the present embodiment. In addition, FIGS. 2A and 2B are partially enlarged views of a bonding arm in the wire bonding apparatus. FIG. 2A shows a top view of the bonding arm, and FIG. 2B shows a bottom view of the bonding arm. FIG. 3 is a perspective view of the wire clamp device of FIG. 1.

As shown in FIG. 1, a wire bonding apparatus 1 includes an XY drive mechanism 10, a Z drive mechanism 12, a bonding arm 20, an ultrasonic horn 30, a bonding tool 40, a load sensor 50, an ultrasonic vibrator 60, a wire clamp device 70, and a wire bonding control unit 90.

The XY drive mechanism 10 is configured to be slidable in the XY-axis direction (a direction parallel to a bonding surface), and the XY drive mechanism (linear motor) 10 is provided with a Z drive mechanism (linear motor) 12 capable of swinging the bonding arm 20 in the Z-axis direction (a direction perpendicular to the bonding surface).

The bonding arm 20 is supported by a support shaft 14 and configured to be swingable with respect to the XY drive mechanism 10. The bonding arm 20 is formed in a substantially rectangular parallelepiped shape to extend from the XY drive mechanism 10 to a bonding stage 16 on which a workpiece (for example, a semiconductor die or a substrate) 18 which is a bonding target is disposed. The bonding arm 20 includes an arm base end 22 which is attached to the XY drive mechanism 10, an arm tip 24 which is positioned on the tip side of the arm base end 22 and to which the ultrasonic horn 30 is attached, and a connection portion 23 which connects the arm base end 22 and the arm tip 24 to each other and has flexibility. The connection portion 23 is constituted by slits 25a and 25b having a predetermined width and extending in a direction from a top face 21a to a bottom face 21b of the bonding arm 20 and a slit 25c having a predetermined width and extending in a direction from the bottom face 21b to the top face 21a of the bonding arm 20. In this manner, since the connection portion 23 is locally formed as a thin portion by the slits 25a, 25b, and 25c, the arm tip 24 is configured to bend with respect to the arm base end 22.

As shown in FIG. 1 and FIG. 2B, a concave portion 26 accommodating the ultrasonic horn 30 is formed on the bottom face 21b side of the bonding arm 20. The ultrasonic horn 30 is attached to the arm tip 24 by a horn fixing spring 32 in a state where the ultrasonic horn 30 is accommodated in the concave portion 26 of the bonding arm 20. The ultrasonic horn 30 holds a bonding tool 40 at a tip protruding from the concave portion 26, and the concave portion 26 is provided with the ultrasonic vibrator 60 generating ultrasonic vibration. Ultrasonic vibration is generated by the ultrasonic vibrator 60, the generated ultrasonic vibration is transmitted to the bonding tool 40 by the ultrasonic horn 30, and the ultrasonic vibration can be applied to a bonding target through the bonding tool 40. The ultrasonic vibrator 60 is, for example, a piezoelectric vibrator.

In addition, as shown in FIG. 1 and FIG. 2A, the slits 25a and 25b are formed on the top face 21a side of the bonding arm 20 in order from the top face 21a toward the bottom face 21b. The upper slit 25a is formed to be wider than the lower slit 25b. In addition, the load sensor 50 is provided in the upper slit 25a formed to be wide. The load sensor 50 is fixed to the arm tip 24 by a spring for preloading 52. The load sensor 50 is disposed to be interposed between the arm base end 22 and the arm tip 24. That is, the load sensor 50 is mounted between the center of rotation of the bonding arm 20 and an attachment surface (that is, a tip face on the bonding tool 40 side in the arm tip 24) of the ultrasonic horn 30 at the arm tip 24 by offsetting in a direction in which the central axis in the longitudinal direction of the ultrasonic horn 30 approaches and separates from a bonding target. In addition, as described above, since the ultrasonic horn 30 holding the bonding tool 40 is attached to the arm tip 24, the arm tip 24 is bent with respect to the arm base end 22 when a load is applied to the tip of the bonding tool 40 due to a reaction force from the bonding target, and the load can be detected by the load sensor 50. The load sensor 50 is, for example, a piezoelectric element load sensor.

The bonding tool 40 is a tool for inserting a wire 42 and is, for example, a capillary provided with an insertion hole 41. In this case, the wire 42 used for bonding is inserted into the insertion hole 41 of the bonding tool 40, and a portion of the wire 42 is extendible from the tip of the wire 42. In addition, the tip of the bonding tool 40 is provided with a pressing portion for pressing the wire 42. The pressing portion has a rotationally symmetrical shape around the insertion hole 41 of the bonding tool 40 in the axial direction and has a pressing surface on the lower surface around the insertion hole 41.

The bonding tool 40 is attached to the ultrasonic horn 30 to be replaceable by a spring force or the like. In addition, the wire clamp device 70 is provided above the bonding tool 40, and the wire clamp device 70 is configured to constrain or release the wire 42 at a predetermined timing. A wire tensioner 46 is further provided above the wire clamp device 70, and the wire tensioner 46 is configured such that the wire 42 is inserted thereinto and is configured to apply suitable tension to the wire 42 being bonded.

The material of the wire 42 is appropriately selected according to ease of processing, low electrical resistance, and the like, and for example, gold (Au), silver (Cu), copper (Ag), or the like is used. Note that, regarding the wire 42, a free air ball 43 extending from the tip of the bonding tool 40 is bonded to a first bonding point of the workpiece 18.

Here, details of the wire clamp device 70 according to the present embodiment will be described with reference to FIG. 3. The wire clamp device 70 includes a pair of arm parts 72a and 72b and a drive part 76 attached to the main body of the wire bonding apparatus 1. The pair of arm parts 72a and 72b respectively include tips 73a and 73b for clamping the wire 42 and base ends 74a and 74b, and extend in a direction substantially perpendicular to a wire axis direction from the tips 73a and 73b toward the base ends 74a and 74b. Clamp pieces 71a and 71b coming into contact with the wire 42 are respectively provided on the surfaces of the tips 73a and 73b which are opposite to each other. In addition, the drive part 76 is provided with a piezoelectric element for driving 80 opening and closing the tips 73a and 73b of the pair of arm parts 72a and 72b. A control power supply, not shown in the drawing, is connected to the piezoelectric element for driving 80, and opening and closing operations of the pair of arm parts 72a and 72b are controlled with a voltage supplied from the control power supply. Ends of the drive part 76 on a side opposite to the pair of arm parts 72a and 72b are fixed to the main body of the wire bonding apparatus 1. Note that, FIG. 1 shows a state where extension directions of the pair of arm parts 72a and 72b are seen from the tips 73a and 73b sides in the wire clamp device 70.

The pair of arm parts 72a and 72b are connected to the drive part 76 through a plurality of connection portions 77a, 77b, 78a, and 78b at the base ends 74a and 74b thereof. Specifically, when the pair of arm parts 72a and 72b are seen from above in the wire axis direction, the pair of connection portions 78a and 78b are provided on both outer sides of the pair of arm parts 72a and 72b, and the pair of connection portions 77a and 77b are provided at a position interposed between the pair of connection portions 78a and 78b. These connection portions are configured as elastically deformable constricted portions. In addition, the pair of connection portions 77a and 77b are connected to each other through an acting portion 79. In such a configuration, the piezoelectric element for driving 80 is provided between the drive part 76 and the acting portion 79 in a state where both ends of the piezoelectric element for driving are fixed. The piezoelectric element for driving 80 expands and contracts in the extension directions of the pair of arm parts 72a and 72b by applying a voltage, so that the connection portions 77a, 77b, 78a, and 78b are elastically deformed to open and close the tips 73a and 73b of the pair of arm parts 72a and 72b. Note that, the connection portions 77a, 77b, 78a, and 78b have a spring property in a direction in which the tips 73a and 73b are closed.

The piezoelectric element for driving 80 is, for example, a stacked piezoelectric actuator in which a plurality of layers of piezoelectric elements are stacked in a direction in which the drive part 76 and the acting portion 79 are connected to each other. In the example shown in FIG. 3, a strain sensor 82 is provided in contact with the piezoelectric element for driving 80. The strain sensor 82 detects a strain occurring due to driving of the piezoelectric element for driving 80. The strain sensor 82 may be bonded to each surface in the vicinity of the piezoelectric element for driving 80. The strain sensor 82 is electrically connected to the wire bonding control unit 90 through wiring 84.

The pair of arm parts 72a and 72b (the clamp pieces 71a and 71b, the tips 73a and 73b, and the base ends 74a and 74b) are formed of a conductive material. Note that, in the present embodiment, an insulating layer 75 is provided in at least one of the base ends 74*a* and 74*b* (the base end 74*b* in FIG. 3) in order to electrically detect that the pair of arm parts 72*a* and 72*b* are set to be in a closed state. The insulating layer 75 prevents occurrence of an electrical short-circuit in portions other than the tips 73*a* and 73*b* when the pair of arm parts 72*a* and 72*b* are set to be in a closed state. Thereby, it is possible to detect that the pair of arm parts 72*a* and 72*b* are set to be in a closed state, for example, by electrical conduction between only the clamp pieces 71*a* and 71*b* of the tips 73*a* and 73*b*.

Next, operations of the wire clamp device 70 will be described. In a state where a voltage is not applied to the piezoelectric element for driving 80, a predetermined load is applied to the tips 73*a* and 73*b* of the pair of arm parts 72*a* and 72*b* in a closed direction. In addition, when a voltage is applied to the piezoelectric element for driving 80, the piezoelectric element for driving 80 extends in the extension directions of the pair of arm parts 72*a* and 72*b* (in other words, a direction in which the drive part 76 and the acting portion 79 are connected to each other) due to an electrostrictive or magnetostriction effect, and thus the acting portion 79 is moved in the directions of the pair of arm parts 72*a* and 72*b*. In this manner, the connection portions 77*a*, 77*b*, 78*a*, and 78*b* are bent outward, and the tips 73*a* and 73*b* are set to be in an open state. Movement amounts of the tips 73*a* and 73*b* (that is, opening amounts of the arm parts) at this time are equivalent to an increase in an extension amount of the piezoelectric element for driving 80 in accordance with a ratio of a length between the connection portions and the tips 73*a* and 73*b* to a length between the acting portion 79 and the connection portions.

In more detail, when a voltage is applied from a state where a voltage to be applied to the piezoelectric element for driving 80 is zero, a wire clamp load according to the tips 73*a* and 73*b* becomes smaller in proportional to a voltage to be applied to the piezoelectric element for driving 80, and the clamp pieces 71*a* and 71*b* of the tips 73*a* and 73*b* are set to be in a mutually contact state (closed state) in a state where the wire clamp load is zero when the value of the voltage is set to a predetermined value. When the voltage to be applied is further increased, the tips 73*a* and 73*b* are asset to be in an open state in a direction in which the tips recede from each other. Note that, a relationship between opening amounts of the pair of arm parts 72*a* and 72*b* accompanying a fluctuation in the voltage to be applied to the piezoelectric element for driving 80 may be measured in advance.

Referring back to FIG. 1, the wire bonding apparatus 1 according to the present embodiment will be further described. The wire bonding control unit 90 is connected to components such as the XY drive mechanism 10, the Z drive mechanism 12, the ultrasonic horn 30 (ultrasonic vibrator 60), the load sensor 50, and the wire clamp device 70 so that transmission and reception of a signal can be performed therebetween, and processing required for wire bonding can be performed by controlling operations of these components by the wire bonding control unit 90.

In addition, an operation unit 92 for inputting control information and a display unit 94 for outputting control information are connected to the wire bonding control unit 90. Thereby, an operator can input necessary control information using the operation unit 92 while recognizing a screen on the display unit 94. Note that, the wire bonding control unit 90 is a computer device including a CPU, a memory, and the like, and a bonding program and the like for performing processing required for wire bonding is stored in the memory in advance. The wire bonding control unit 90 is configured to control operations required in performing calibration of a wire clamp device to be described later (for example, a program causing a computer to execute each operation is included).

The wire bonding control unit 90 according to the present embodiment includes a reference voltage acquisition unit 90*a*, a voltage calibration unit 90*b*, a strain detection unit 90*c*, and a voltage control unit 90*d*.

The reference voltage acquisition unit 90*a* acquires a reference voltage at which the pair of arm parts 72*a* and 72*b* are set to be in a closed state when the piezoelectric element for driving 80 is driven with a driving voltage. Specifically, the reference voltage acquisition unit 90*a* detects a timing when the pair of arm parts 72*a* and 72*b* are set to be in a closed state when the piezoelectric element for driving 80 is driven, that is, a state where the clamp pieces 71*a* and 71*b* of the tips 73*a* and 73*b* are in a mutually contact (load zero point) in a state where a wire clamp load is zero, and acquires a voltage applied to the piezoelectric element for driving 80 at this time as a reference voltage.

In the present embodiment, the acquisition of a reference voltage by the reference voltage acquisition unit 90*a* is performed depending on whether or not the pair of arm parts 72*a* and 72*b* are in an electrically conduction state. In this case, it is preferable to electrically detect a state where the clamp pieces 71*a* and 71*b* come into contact with each other in a state where the wire 42 is not inserted. Thereby, it is possible to accurately detect a timing when a load zero point is set. The electrical detection can be performed by applying a voltage to the arm parts 72*a* and 72*b* to detect whether or not a current flows between the clamp pieces 71*a* and 71*b* of the tips 73*a* and 73*b*.

The voltage calibration unit 90*b* calibrates a driving voltage to be applied to the piezoelectric element for driving 80 on the basis of detection results of the reference voltage acquisition unit 90*a*. When desired opening amounts of the pair of arm parts 72*a* and 72*b* required for each step of wire bonding processing are calculated in advance and changes in the opening amounts of the pair of arm parts 72*a* and 72*b* corresponding to the driving voltage of the piezoelectric element for driving 80 are calculated in advance, the driving voltage of the piezoelectric element for driving 80 required for each step of the wire bonding processing can be accurately calibrated by specifying a load zero point reference voltage.

The strain detection unit 90*c* detects an output value of the strain sensor 82 accompanying driving of the piezoelectric element for driving 80. Since the strain sensor 82 is disposed in contact with the piezoelectric element for driving 80, the output value of the strain sensor 82 changes with driving of the piezoelectric element for driving 80. Consequently, it is possible to accurately control a driving voltage of the piezoelectric element for driving 80 by calculating a relationship between the output value of the strain sensor 82 and changes in the opening amounts of the pair of arm parts 72*a* and 72*b* due to the driving of the piezoelectric element for driving 80 in advance. Particularly, in the present embodiment, since the strain sensor 82 is disposed in contact with the piezoelectric element for driving 80 and a change accompanying driving of the piezoelectric element for driving 80 can be directly detected, it is possible to more accurately control a driving voltage of the piezoelectric element for driving 80.

The voltage control unit 90*d* controls a driving voltage of the piezoelectric element for driving 80 on the basis of detection results of the strain detection unit 90*c*. In this manner, it is possible to more accurately control the wire clamp device by monitoring an operation state of the piezoelectric element for driving 80 through the strain sensor 82 by the strain detection unit 90*c* and performing feedback control of such a monitoring result to a driving voltage of the piezoelectric element for driving 80.

Figure 4:
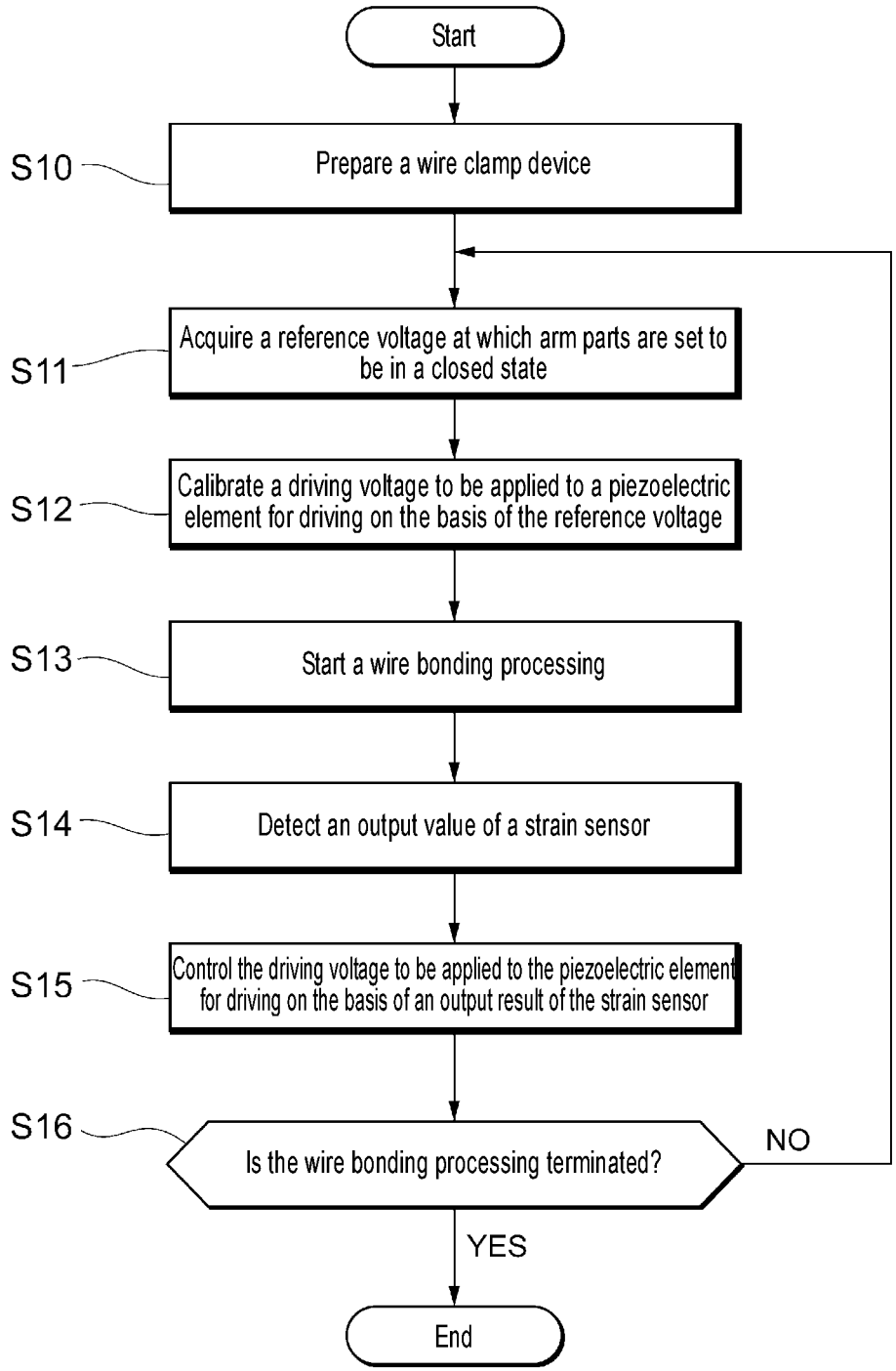
FIG. 4 is a flowchart showing a method of calibrating the wire clamp device according to the first embodiment of the present invention.

Next, a method of calibrating a wire clamp device according to the present embodiment will be described with reference to FIG. 4. FIG. 4 shows a flowchart of this method. This method can be performed using the wire bonding apparatus 1 described above. The method of calibrating the wire clamp device can be performed at the time of termination of wire bonding (that is, before the next wire bonding is started), at the time of teaching for wire bonding, or the like.

First, the wire clamp device 70 is prepared (S10). Specifically, the wire clamp device 70 is mounted on a bonding head to be incorporated as a component of the wire bonding apparatus 1.

Next, a reference voltage at which the arm parts 72*a* and 72*b* are set to be in a closed state (for example, a state of the above-described load zero point) is acquired (S12). Specifically, a driving voltage is supplied to the piezoelectric element for driving 80 through the wire bonding control unit 90, opening and closing operations of the arm parts 72*a* and 72*b* are performed, and a load zero point reference voltage corresponding to the load zero point is acquired by the reference voltage acquisition unit 90*a*. In the present embodiment, a reference voltage is acquired by detecting whether or not a current has flowed between the clamp pieces 71*a* and 71*b* of the tips 73*a* and 73*b*. In this case, it is possible to detect a timing of a load zero point by gradually increasing a driving voltage from a state where the driving voltage of the piezoelectric element for driving 80 is zero. Alternatively, on the contrary, the arm parts 72*a* and 72*b* may be set to be in an open state by setting a driving voltage of the piezoelectric element for driving 80 to a predetermined value and the driving voltage may be gradually decreased from this state to acquire a load zero point reference voltage. In addition, it is more preferable to detect a timing of a load zero point by repeatedly increasing or decreasing a driving voltage and acquire a load zero point reference voltage on the basis of the detected timing. Note that, the reference voltage acquired by the reference voltage acquisition unit 90*a* may be displayed on the display unit 94.

Next, a driving voltage to be applied to the piezoelectric element for driving 80 is calibrated on the basis of the reference voltage (S12). For example, an operator may identify the reference voltage acquired by the reference voltage acquisition unit 90*a* and displayed on the display unit 94 and may calibrate the driving voltage by the voltage calibration unit 90*b* through the operation unit 92 on the basis of the reference voltage. Alternatively, the voltage calibration unit 90*b* having received a signal indicating the reference voltage acquired by the reference voltage acquisition unit 90*a* may automatically calibrate the driving voltage. When an opening amount of the arm part corresponding to the driving voltage is calculated, it is possible to accurately control an opening amount of the wire clamp device in wire bonding processing by specifying a reference voltage of a load zero point.

The wire bonding processing is started using the wire clamp device 70 in which the driving voltage is calibrated in this manner (S13). During the wire bonding processing, an output value of the strain sensor 82 is detected through the strain detection unit 90*c* (S14), and a driving voltage to be applied to the piezoelectric element for driving 80 is controlled through the voltage control unit 90*d* on the basis of an output result of the strain sensor 82 (S15). In this manner, it is possible to control the driving voltage on the spot in accordance with a driving state of the piezoelectric element for driving 80 and accordingly control opening and closing operations (opening amounts) of the pair of arm parts 72*a* and 72*b* with a high level of accuracy.

Thereafter, it is determined whether or not the wire bonding processing is terminated (S16). In a case where the wire bonding processing is not terminated and is continued (NO in S16), the processing returns to step S11. On the other hand, in a case where the wire bonding processing is terminated (YES in S16), this method is terminated. Meanwhile, the processes of steps S11 to S15 can be performed with the termination of the wire bonding processing for one or a plurality of workpieces as a trigger.

As described above, according to the present embodiment, a timing when the pair of arm parts 72*a* and 72*b* are set to be in a closed state is detected by electrical conduction between the tips 73*a* and 73*b* of the pair of arm parts 72*a* and 72*b*, and a driving voltage to be applied to the piezoelectric element for driving 80 is calibrated on the basis of a reference voltage at which the pair of arm parts 72*a* and 72*b* are set to be in a closed state. Thereby, it is possible to accurately adjust opening amounts of the pair of arm parts 72*a* and 72*b*. Accordingly, it is possible to perform accurate and stable wire bonding.

In addition, according to the present embodiment, since the strain sensor 82 disposed in contact with the piezoelectric element for driving 80 is provided, it is possible to directly detect changes accompanying driving of the piezoelectric element for driving 80. Therefore, it is possible to more accurately control a driving voltage of the piezoelectric element for driving 80.

Second Embodiment

Figure 5:
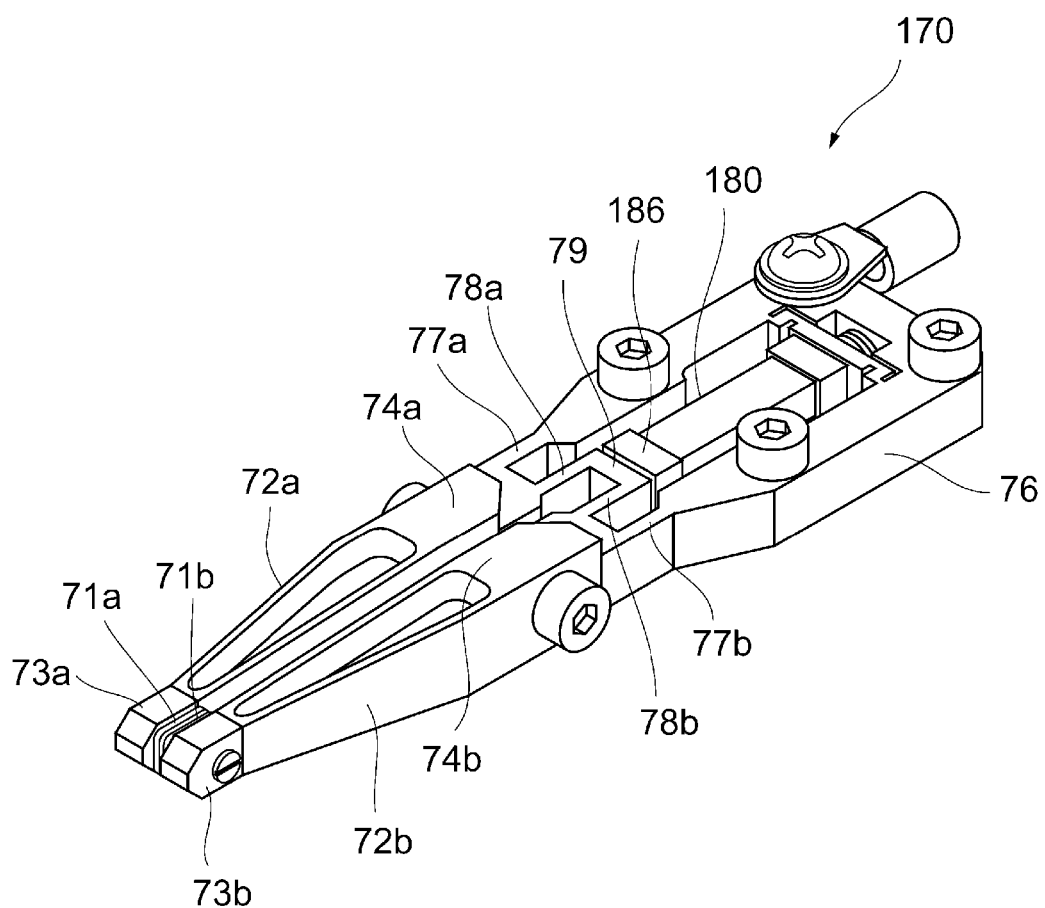
FIG. 5 is a perspective view of a wire clamp device according to a second embodiment of the present invention.
Figure 6:
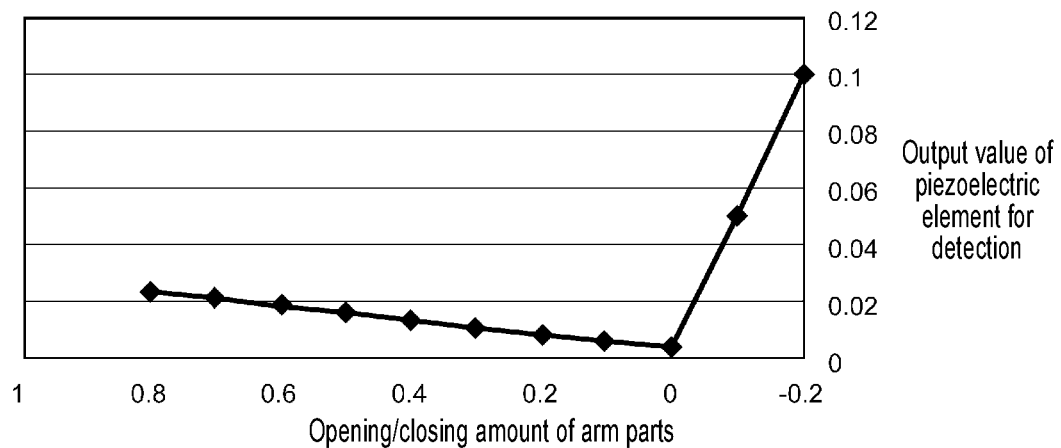
FIG. 6 is a graph illustrating a method of calibrating the wire clamp device according to the second embodiment of the present invention.

Next, a second embodiment of the present invention will be described with reference to FIGS. 5 and 6. FIG. 5 is a perspective view of a wire clamp device according to the present embodiment. In addition, FIG. 6 is a graph illustrating a method of calibrating the wire clamp device of FIG. 5.

In the first embodiment, a mode in which a timing when the pair of arm parts 72*a* and 72*b* are set to be in a closed state is electrically detected has been described. However, the present embodiment is different from the first embodiment in that the timing is detected by a piezoelectric element for detection 186. Hereinafter, differences from the contents of the first embodiment will be described. Note that, in FIG. 5, components denoted by the same reference numerals as those in FIG. 3 will not be described.

A wire clamp device 170 according to the present embodiment includes a pair of arm parts 72*a* and 72*b* and a drive part 76 attached to the main body of the wire bonding apparatus 1, and the drive part 76 is provided with a piezoelectric element for driving 180 and a piezoelectric element for detection 186. The piezoelectric element for driving 180 may be disposed in contact with a strain sensor, similar to the contents described in the first embodiment.

The piezoelectric element for detection 186 detects stress generated in association with opening and closing of the pair of arm parts 72*a* and 72*b* by the piezoelectric element for driving 180. The piezoelectric element for detection 186 is provided adjacent to the piezoelectric element for driving 180 in a movement direction of the piezoelectric element for driving 180 (that is, an expansion/contraction direction). In other words, the piezoelectric element for detection 186 is disposed in series with the piezoelectric element for driving 180 between the drive part 76 and an acting portion 79.

In the example shown in FIG. 5, the piezoelectric element for detection 186 is provided between the piezoelectric element for driving 180 and base ends 74a and 74b of the pair of arm parts 72a and 72b in the extension directions of the pair of arm parts 72a and 72b. Thereby, the piezoelectric element for detection 186 can receive stress from the piezoelectric element for driving 180 at one end thereof and can receive stress from the acting portion 79 at the other end thereof, and thus it is possible to accurately detect stress generated in association with opening and closing of the pair of arm parts 72a and 72b.

In the clamp device 170, an inflection point of a timing when the pair of arm parts 72a and 72b are set to be in a closed state can be detected by the piezoelectric element for detection 186. This will be described in detail with reference to FIG. 6. In FIG. 6, the vertical axis represents an output value of a piezoelectric element for detection, and the horizontal axis represents an opening/closing amount of a pair of arm parts. Note that, regarding the opening/closing amount on the horizontal axis, a positive value is a value in an opening direction, a negative value is a value in a closing direction, and zero indicates a closed state.

An example of this detection method will be described. First, a voltage having a predetermined value is applied to the piezoelectric element for driving 180 to set the pair of arm parts 72a and 72b to be in an open state (for example, a state of 0.8 in FIG. 6), and a voltage to be applied to the piezoelectric element for driving 180 is gradually decreased from this state to bring the pair of arm parts 72a and 72b gradually close to a closed state. In addition, when a voltage to be applied to the piezoelectric element for driving 180 is continuously decreased to set a closed state where clamp pieces 71a and 71b of tips 73a and 73b come into contact with each other (a state of zero on the horizontal axis of FIG. 6), stress is released in a contraction direction of the piezoelectric element for driving 180, and this becomes an inflection point and appears in an output of the piezoelectric element for detection 186. In this manner, it is possible to detect a load zero point by the piezoelectric element for detection 186 and to acquire a voltage applied to the piezoelectric element for driving 180 at this time as a reference voltage.

Note that, the arrangement of the piezoelectric element for detection 186 is not limited to the above-described arrangement, and the piezoelectric element for detection 186 may be disposed on a side opposite to the acting portion 79 in the piezoelectric element for driving 180 as a modification example. Also in this case, the above-described inflection point can be detected by the piezoelectric element for detection 186.

In the present embodiment, materials of the pair of arm parts 72a and 72b are not particularly limited, and the materials may be conductive materials or insulating materials. In addition, the insulating layer 75 described in the first embodiment may not be provided.

The present invention is not limited to the above-described embodiments, and can be modified in various manners and applied.

In the above-described embodiments, regarding a timing when the pair of arm parts 72a and 72b are set to be in a closed state, a mode in which a state where the clamp pieces 71a and 71b of the tips 73a and 73b come into contact with each other is detected has been described, but the present invention is not limited thereto. For example, regarding detection performed by the reference voltage acquisition unit 90a, a state where the clamp pieces 71a and 71b come into contact with a wire 42 in a state where the wire 42 is inserted may be detected.

Further, a mode adopting both a configuration in which the state of a load zero point is detected and a configuration in which an output value of a strain sensor accompanying driving of a piezoelectric element for driving is detected has been described in the above-described embodiments, but only one configuration may be adopted as a modification example.

Further, in the present invention, a relationship between the direction of a voltage to be applied to a piezoelectric element for driving and opening and closing operations of arm parts is not limited to the above-described embodiments, and the relationship therebetween can be appropriately set.

Further, in the present invention, components of a wire clamp device are not limited to the above-described embodiments, and are not particularly limited as long as opening and closing operations of arm parts can be performed by driving of a piezoelectric element for driving.

The aspects of implementation described through the above-described embodiments of the present invention can be used by suitable combination depending on purpose, or adding changes or improvements, and the present invention is not limited to the description of the above-described embodiments. It is apparent from the description that embodiments having such a combination, changes, or improvements added thereto may be included in the scope of the present invention.

The invention claimed is:

1. A method of calibrating a wire clamp device with a reference voltage acquisition unit, the method comprising:
   providing the wire clamp device that includes a pair of arm parts each arm having a tip for clamping a wire and extending from the tip toward a base end thereof, and a drive part coupled to base ends of the pair of arm parts through a plurality of connection portions at the based ends of the pair of arm parts and provided with a piezoelectric element for driving opening and closing the tips of the pair of arm parts with a driving voltage;
   coupling the reference voltage unit to the pair of arm parts and the piezoelectric element, wherein the piezoelectric element configured to drive the pair of arm parts include expanding and contracting the pair of arm parts in an extension direction toward the base end;
   detecting a timing by the reference voltage acquisition unit when the pair of arm parts are set to be in a closed state by electrical conduction between the tips of the pair of arm parts when the piezoelectric element for driving opening and closing the tips of the pair of arm parts is driven with the driving voltage, and acquiring a reference voltage at which the pair of arm parts are set to be in a closed state by the reference voltage acquisition unit;
   coupling a voltage calibration unit to the pair of arm parts and the piezoelectric element; and
   calibrating the driving voltage by the voltage calibration unit to be applied to the piezoelectric element for driving on a basis of the reference voltage from the acquiring the reference voltage by the reference voltage acquisition unit.

2. The method according to claim 1,
   wherein the drive part of the wire clamp device is provided with a strain sensor configured to come into contact with the piezoelectric element for driving, and the method further comprises detecting an output value of the strain sensor charging with driving of the piezoelectric element for driving and controlling the driving voltage to be applied to the piezoelectric element for driving opening and closing the tips of the pair of arm parts on a basis of the output value of the strain sensor in wire bonding processing after the driving voltage to be applied to the piezoelectric element for driving is calibrated.

* * * * *